United States Patent
Herzinger et al.

(10) Patent No.: US 7,420,411 B2
(45) Date of Patent: Sep. 2, 2008

(54) VOLTAGE CONTROL CIRCUIT AND METHOD FOR SUPPLYING AN ELECTRICAL COMPONENT WITH A SUPPLY VOLTAGE

(75) Inventors: Stefan Herzinger, München (DE); Gunther Kraut, Egmating (DE)

(73) Assignee: Infineon Technologies AG, Munich (DE)

( * ) Notice: Subject to any disclaimer, the term of this patent is extended or adjusted under 35 U.S.C. 154(b) by 332 days.

(21) Appl. No.: 11/370,752

(22) Filed: Mar. 8, 2006

(65) Prior Publication Data

US 2006/0214649 A1 Sep. 28, 2006

(30) Foreign Application Priority Data

Mar. 9, 2005 (DE) .................. 10 2005 010 904

(51) Int. Cl.
*H03F 3/38* (2006.01)
*H03G 3/20* (2006.01)

(52) U.S. Cl. .................. 330/10; 330/127; 330/297; 455/127.1

(58) Field of Classification Search .................. 330/10, 330/127, 297; 455/127.1
See application file for complete search history.

(56) References Cited

U.S. PATENT DOCUMENTS 7,058,373 B2 * 6/2006 Grigore .................. 455/127.1
7,135,918 B1 * 11/2006 Outaleb et al. ................ 330/10
2005/0101263 A1 * 5/2005 Kim .......................... 455/78

FOREIGN PATENT DOCUMENTS

| DE | 100 45 761 A1 | 3/2002 |
|---|---|---|
| EP | 1 255 390 A1 | 11/2002 |
| EP | 1450479 | 8/2004 |

OTHER PUBLICATIONS

ON Semiconductor "Switchmode™ Power Supply Reference Manual and Design Guide", SMPSRM/D, Rev. 3, Jul. 2002, 64 pgs.
"Switching Regulators", Walt Kester and Brian Erisman, Section 3, Analog Devices Technical Library on Power Management, 1999, 71 pgs.

* cited by examiner

*Primary Examiner*—Gary L Laxton
(74) *Attorney, Agent, or Firm*—Eschweiler & Associates, LLC

(57) ABSTRACT

A voltage control circuit is proposed, having an input for supplying a voltage control signal and having an output for production of a supply voltage. The voltage control circuit contains a control loop with a DC/DC converter arranged between a first node and a second node. The first node is designed to emit the difference between signals which are applied on the input side. The second feed node is designed to emit the sum of the applied signals. The first and the second feed nodes provide two point modulation with the DC/DC converter within the control loop of the voltage control circuit. In this case, a signal which is applied on the input side is split into a radio frequency component and a low frequency component. The processing of the low frequency component in the DC/DC converter reduces the requirements for the switching frequencies for the DC/DC converter, increases the efficiency of the voltage control circuit, and reduces the power losses.

20 Claims, 5 Drawing Sheets

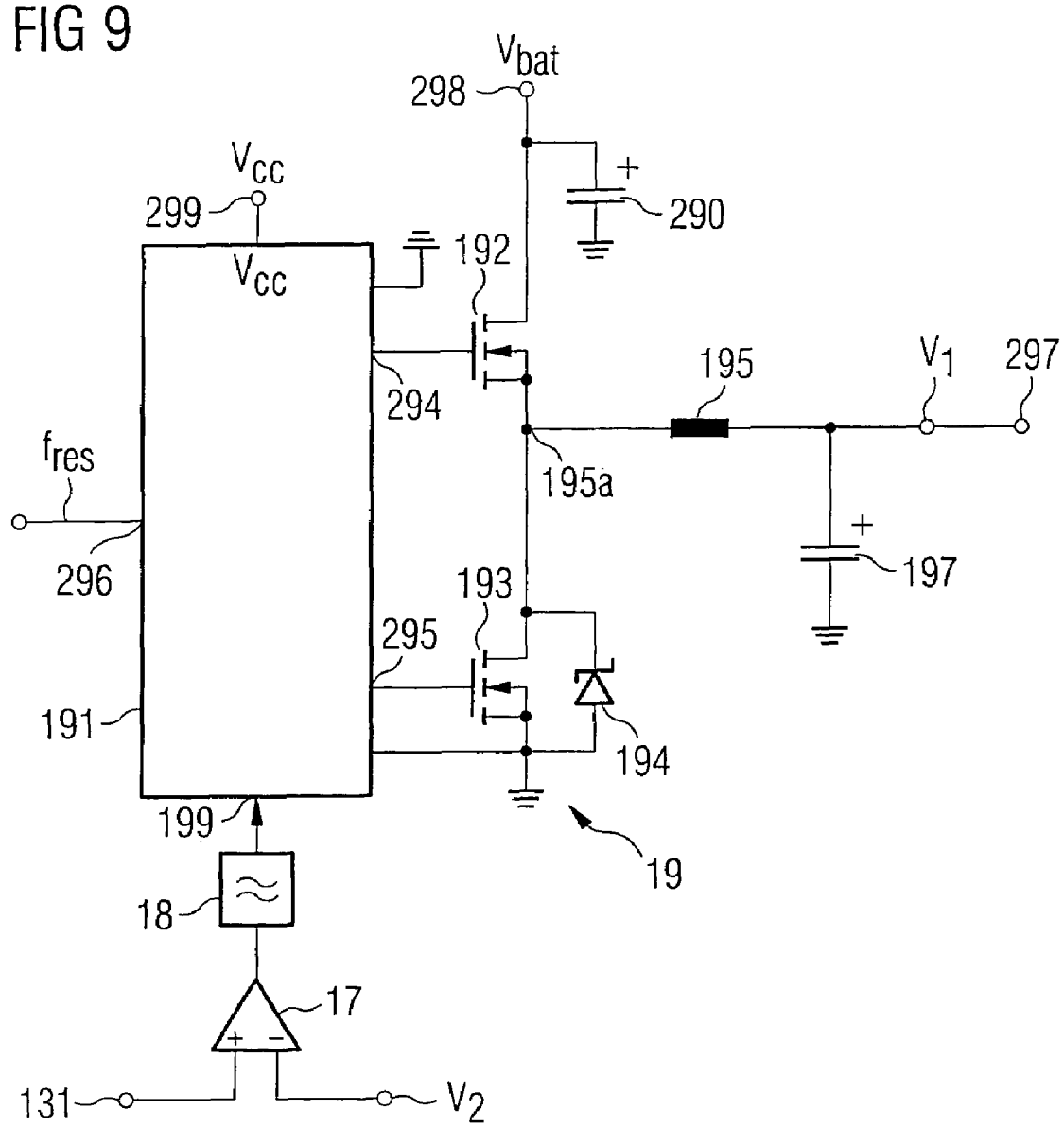

VOLTAGE CONTROL CIRCUIT AND METHOD FOR SUPPLYING AN ELECTRICAL COMPONENT WITH A SUPPLY VOLTAGE

FIELD OF THE INVENTION

The invention relates to a voltage control circuit. The invention furthermore relates to a method for supplying an electrical component with a supply voltage.

BACKGROUND OF THE INVENTION

Mobile communication appliances are increasingly making use of radio-frequency transmission architectures which apply the amplitude variation that is required for modulation of the payload data to the radio-frequency output signal at the output stage of the transmission path. The expression amplitude variation is used in this context not only for high-speed amplitude modulation with respect to the modulation type used for the payload data but also for the relatively slow variation of an output level setting.

Frequently, phase modulation is first of all carried out in transmission paths as a function of the modulation type used and of the data to be transmitted on the transmission signal, with the amplitude of a phase-modulated transmission signal then being varied. The amplitude modulation for the transmission of the payload data is in this case at a considerably higher frequency than the comparatively slow adjustment of the output level.

Transmitters which operate on this principle are referred to, inter alia, as EER transmitters (short for "Envelope Elimination and Restoration"), polar-loop transmitters or polar transmitters. One amplitude modulation option that is frequently used in this case is power adjustment of an amplifier stage by the application of a supply voltage to the amplifier stage. This is frequently done using a so-called series regulator, which essentially varies the supply voltage to the amplifier stage via a controlled transistor with the aid of the amplitude modulation signal.

However, this principle has the disadvantage that a relatively large amount of power is consumed uselessly via the series regulator. Even when the amplifier stage is being operated at the maximum output power, that is to say with the minimum voltage drop across the series regulator, a not inconsiderable amount of heat is produced, depending on the amplitude modulation. Since the amplitude modulation and, in particular, its signal statistics are in fact governed by the mobile communication standard being used, the power losses represent an upper limit on the efficiency of the transmitter.

In order to keep the power losses resulting from the voltage drop in the supply voltage across the voltage regulator as small as possible the input of the voltage regulator is not connected directly to the supply voltage $V_{bat}$ as described in one embodiment that is known to the inventor, but a voltage regulator 19c is connected between the supply voltage and the input of the voltage regulator 15a. The regulator 19c is used to convert the supply voltage $V_{bat}$ to a different value, and is also referred to in the following text as a DC/DC converter. In consequence, the series regulator can also be readjusted, thus reducing the voltage drop across the series regulator 15a. If the radio-frequency output power via the radio-frequency amplifier 11 is decreased, as is achieved by reducing the voltage V2 at the supply input to the radio-frequency amplifier, the efficiency of the overall arrangement thus does not decrease so severely. For this purpose, the power level information which is derived from the maximum desired power emitted at the output of the output amplifier 11 is applied to the first control input 131 a of the voltage converter 19c. The series regulator arrangement 15a is also supplied with the radio-frequency amplitude modulation signal at its control input 132a.

In general, the series regulator 15a has to have a considerably wider signal bandwidth for application of the modulation to the supply voltage to the radio-frequency amplifier 11 than is required just for pure power control of the output power of the radio-frequency amplifier 11. It is expedient to choose the bandwidth for the amplitude modulation signal, that is to say in particular the bandwidth of the series regulator 15a, to be greater by a factor of about 10 than the channel bandwidth of the amplitude modulation being used, in order to reduce distortion.

A further known circuit for supplying voltage to the radio-frequency amplifier 11 is shown in FIG. 9. In the case of this amplifier, the power level information and the amplitude information are contained in the control signal at the input 13 in a DC/DC converter 19b. The so-called amplitude modulation word AW is supplied to the control input, in response to which the converter adjusts its output voltage V2 appropriately. Particularly in the case of clocked DC/DC converters, there are accordingly two mutually contradictory requirements. High efficiency should be achieved on the one hand, with a wide control bandwidth on the other hand. These two requirements are virtually impossible to combine in all relevant mobile radio systems. The signal bandwidth for the amplitude modulation should, as already mentioned, be ten times the modulation bandwidth of the switching elements which are processing the amplitude modulation signal. For a clocked DC/DC converter, this would result in the clock frequency having to be one hundred times as great as the modulation bandwidth. A converter such as this would have to produce spectral components in the modulation sidebands of the radio-frequency spectrum in its output signal, thus necessitating analog post-filtering. This filtering would have to have a high level of stop-band attenuation, which could be achieved only with major difficulty within the DC/DC converter or the voltage converter, owing to the high switching currents that occur.

SUMMARY OF THE INVENTION

One object of the invention is to provide a voltage control device by means of which high-speed amplitude modulation can be achieved, with high efficiency at the same time. A further object of the invention is to specify a method for high-speed and high-efficiency adjustment of a supply voltage.

In one embodiment of the invention, the voltage control circuit comprises an input for supplying an input voltage as well as an output for production of a supply voltage. It also contains and an input for supplying a voltage control signal for adjustment of the output voltage. A control loop between the input and the output of the voltage control circuit is designed with a first feed element and a second feed element. A voltage converter whose output voltage is variable is arranged between the first feed element and the second feed element. The first feed element is designed to emit the difference between signals which are applied to a first and to a second connection to a control input of the voltage converter, with the first connection being coupled to the input of the voltage control circuit, and the second connection being coupled to the output of the voltage control circuit, forming a feedback path. The second feedback element is designed to emit the sum of signals which are applied to a first and a second connection, with the first connection being connected to a voltage output of the voltage converter, and the second connection being connected to the input of the voltage control circuit. One output of the second feed element forms the output of the voltage control circuit.

According to the proposed principle, the amplitude modulation signal at the input of the voltage control circuit is split into two paths of different bandwidth, and they are joined together again at the output of the voltage control circuit. In this case, the signal path with a narrow bandwidth is passed via the voltage converter. A radio-frequency component of the amplitude modulation signal is not supplied to the voltage converter, but is fed in once again directly at the output of the converter. This is possible because the signal path with the radio-frequency components of the amplitude modulation signal carries relatively little signal energy with virtually all conventional types of modulation, but is essential in order to maintain the transmission spectrum and the modulation accuracy.

The separation of the amplitude modulation signal into a low-frequency signal component and a radio-frequency signal component and the different processing of the two signal components in different signal paths of the voltage control circuit are carried out by two-point modulation of the voltage control signal which is supplied in the voltage control circuit. Two-point modulation allows addition of two broadband constant transfer functions, while at the same time compensating for the poles and zeros that occur. In this case, poles and zeros are advantageously based on a common analog implementation in the form of a loop dynamic, thus inherently compensating for tolerances which occur as a result of component scatters.

The first feed element in the voltage control circuit according to the embodiment of the invention corresponds to a low-pass filter element, and the second feed element corresponds to a high-pass filter element. The high-pass and low-pass filter functions which are defined in the control loop inherently complement one another to produce unity, thus ensuring an essentially constant transfer function. This makes it possible to provide a narrowband voltage converter in the voltage control circuit and nevertheless to apply relatively high-frequency voltage control signals to it, for amplitude modulation of the supply voltage. The requirement for the converter is thus reduced, while nevertheless retaining high efficiency. The converter is advantageously in the form of a converter which is operated on a clocked basis.

In one embodiment of the invention, a loop filter is connected upstream of the voltage converter in the control loop. This loop filter suppresses the radio-frequency component of a voltage control signal which is applied to the input. In a further embodiment, the voltage converter is in the form of a DC/DC converter, or a part of a DC/DC converter, a DC voltage converter or a switched-mode regulator with a variable conversion ratio.

In another embodiment of the invention, the first feed element has a control amplifier, with a first input of the control amplifier forming the first connection of the first feed element, and a second input of the control amplifier forming the second connection of the first feed element.

In another embodiment of the invention, the second feed element is once again in the form of a voltage adder. In one development of the invention, the second feed element has a controllable-conductivity path connected in series between the first connection of the second feed element and the output of the voltage control circuit. The second feed element and, in particular, the controllable-conductivity switched path are used for modulation of the radio-frequency component onto the supply voltage which is emitted from the voltage control circuit. The controllable-conductivity path is preferably in the form of an element of a series regulator.

In another embodiment of the invention, the second feed element has a control amplifier, whose output is coupled to a control input of the controllable-conductivity path. The controllable path preferably contains at least one bipolar transistor. In an alternative embodiment, the controllable-conductivity path has at least one field-effect transistor. The second feed node is thus designed to determine any voltage drop across the controllable-conductivity path. In consequence, the modulated supply output voltage is not regulated with respect to ground but via a voltage drop across the controllable-conductivity switched path.

In another development of the invention, an additional differential amplifier in the form of a subtractor is provided in order to detect this controllable variable. The two inputs of this differential amplifier are coupled to the switched path, and one output is fed back to an input of the control amplifier for the second feed element.

In a further embodiment of the invention, a correction device is connected upstream of the first connection of the first feed element and of the second connection of the second feed element. This correction device is designed to emit a first voltage to the first connection of the first feed element, and to emit a second voltage to the second connection of the second feed element. In this case, the first voltage and the second voltage preferably have the same magnitude, but different mathematical signs.

This embodiment advantageously allows a DC voltage component at one input of the voltage converter or the DC/DC converter within the control loop of the voltage control circuit to be added, which is sufficiently large to avoid saturation of the switched path. The controlled path can thus be operated approximately without any distortion. In order to compensate for this additional DC voltage component, a corresponding signal with the opposite mathematical sign is supplied to the second feed element and thus provides correction with respect to the output of the voltage control circuit. In one advantageous embodiment, the core line of the series regulator can be shifted by suitable definition of the first and second voltage signals, thus also making it possible to achieve an efficiency advantage.

According to one embodiment of the invention, the voltage control circuit can preferably be used for production of a supply voltage for a radio-frequency amplifier in a transmitter. In particular, an amplitude modulation signal can be modulated directly onto the supply voltage of the radio-frequency transmitter, so that the output power of the radio-frequency signal to be amplified is modulated in the same way. The voltage control circuit can accordingly preferably be used for transmitters which are designed for polar modulation.

The method for supplying an electrical component with a supply voltage comprises the following steps:
  production of a modulation signal for supply voltage adjustment;
  production of an input voltage;
  determination of a first signal element with a first frequency component from the modulation signal, and determination of a second signal element with a second frequency component from the modulation signal;
  production of a first voltage from the input voltage as a function of the first signal element;
  modulation of the first voltage as a function of the second signal element;

supply of the modulated first voltage as a supply voltage to the electrical component.

A first voltage is thus produced with the aid of a first signal element from an input voltage which, for example, can be derived from a battery voltage or from some other DC voltage source, and this is then modulated with the second signal element. The two signal elements are derived from the modulation signal that is provided. In this case, the first signal element contains only low-frequency components which essentially transport most of the energy of the modulation signal. These low-frequency components are used to produce a first voltage. Considered in the time domain, the first voltage is amplitude-modulated, with the frequencies of the amplitude modulation corresponding to the frequency components of the first signal element.

The first voltage is then modulated with the second signal element, which has radio-frequency components. The electrical component may be an amplifier, an active filter, a mixer or some other active component which requires a supply voltage for signal processing. The method is particularly suitable for polar modulators for amplitude modulation.

It is expedient to provide a voltage converter with a variable converter ratio and preferably a DC voltage converter, DC/DC converter, switched-mode regulator or some other converter which is designed to convert a basic voltage to an output voltage. A DC/DC converter or switched-mode regulator may either be in the form of a down converter or else in the form of an up converter (boost regulator). The conversion ratio is set by means of the first signal element. The basic voltage is then converted to the first voltage on the basis of the selected converter ratio.

BRIEF DESCRIPTION OF THE DRAWINGS

The invention will be explained in detail in the following text with reference to the drawings, in which:

FIG. 9 shows a DC/DC converter, as is used in one embodiment of the invention.

DETAILED DESCRIPTION OF THE INVENTION

In order to minimize the power losses during modulation of the supply voltage of a radio-frequency amplifier, it is possible to use a voltage converter which is preferably in the form of a DC/DC converter. The expression DC/DC converter in the following text is used to mean a circuit which converts a first voltage to a second voltage. In addition, regulation is required in order to stabilize the output voltage of the converter. The output side of the converter is connected to the supply input of the amplifier.

DC/DC converters are operated on a clocked basis, and convert one voltage, for example from a battery, to a second voltage. The output voltage which is emitted from the converter may in this case be less than the input voltage (step-down converter) or greater than the input voltage (boost converter). The conversion ratio is in this case supplied to the converter by means of an amplitude modulation word. In the case of radio-frequency amplitude modulation, as is required by way of example for a number of mobile radio standards for payload data modulation, this leads to the clock signal which is required for clocked operation of the DC/DC converter having to correspond to several times the modulation bandwidth. This value results from the requirement that the bandwidth should be a multiple of that required for signal processing. The clock signal for the converter should in turn be at a considerably higher frequency. This results, for example, in a payload signal bandwidth of 270.8 kHz for the EDGE Standard. The bandwidth for the amplitude modulation signal is higher by a factor of 10, in order to avoid distortion. This results in a frequency of about 30 MHz for the clock signal for the DC/DC converter.

Since, in practice, this can be produced only with very great difficulty and major complexity, the amplitude modulation signal is, according to the proposed principle, separated into two paths with different bandwidths, and they are joined together again at the output of the voltage control circuit. The signal path with the narrow bandwidth, that is to say a modulation signal at a low frequency, passes via the DC/DC converter. The bandwidth requirement for the DC/DC converter is thus reduced. In particular, it is possible to reduce the frequency of the clock signal for the converter. The signal path with radio-frequency components of the amplitude modulation signal contains a relatively small amount of signal energy, but is of major importance for the information content and the frequency spectrum of the output signal.

Splitting the amplitude modulation signal into a radio-frequency component and a low-frequency component and the different processing of the two components are achieved by two-point modulation of the amplitude modulation signal. This method is distinguished in that poles and zeros are based on a common analog implementation in the form of a loop dynamic, and provide mutual correction for tolerances resulting from components.

Figure 1A:
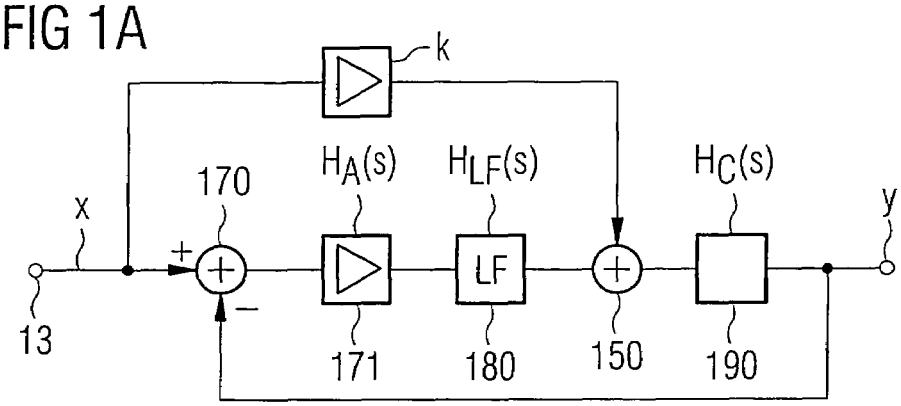
FIG. 1A shows a block diagram of a control loop in order to explain the principle according to the invention.

FIG. 1A shows a block diagram of one such control loop, which is suitable for the transmission of a broadband signal with the aid of the two-point modulation method. In this case, modulation is applied in the control loop both at a low-pass filter point 170 and at a high-pass filter point 150. The high-pass and low-pass filter functions which are defined by the control loop inherently complement one another to form unity. In general, the transfer function of the low-pass filter point $H_{TP}(S)$ is:

$$H_{TP} = \frac{1}{X_{TP}} = \frac{H_A(s) \cdot H_{2F}(s) \cdot H_C(s)}{1 + H_A(s) \cdot H_{LF}(s) \cdot H_C(s)}$$

The transfer function $H_{HP}(S)$ for the corresponding high-pass filter point 150 is:

$$H_{TP} = \frac{k \cdot y}{X_{HP}} = \frac{k \cdot H_C(s)}{1 + H_A(s) \cdot H_{LF}(s) \cdot H_C(s)}$$

The total transfer function $H_{tot}(s)$ is obtained from the sum of the high-pass and low-pass filter transfer function $H_{TP}(S)+$ $H_{HP}(s)$. Subject to the condition that the amplification element k is a proportional element for which $k=1/H_{HC}$, the value of the overall transfer function is unity.

Figure 1B:
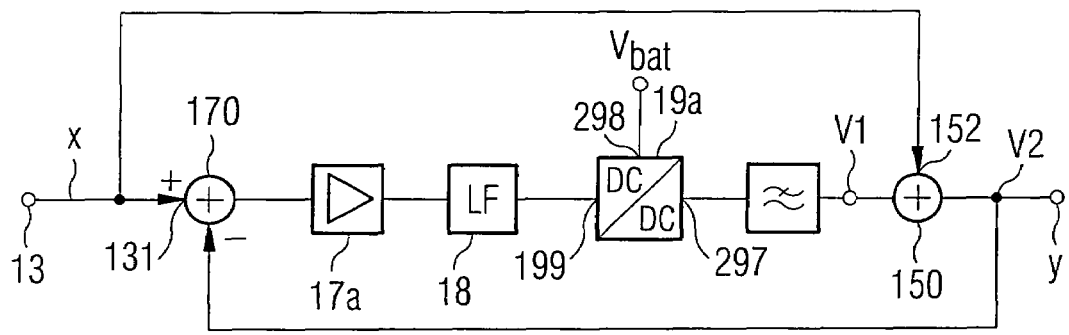
FIG. 1B shows a block diagram of the control loop of the voltage control circuit.

According to the proposed principle, amplitude control is carried out within the voltage control circuit by means of two-point modulation, with a DC/DC converter being provided within the control path. FIG. 1b shows a corresponding block diagram of one such voltage control circuit. In this case, a DC/DC converter 19a is connected between a first feed element 170 and the second feed element 150 within the control loop. The first feed element 170 acts as a low-pass filter point, while the second feed element 150 forms the corresponding high-pass filter point. A loop filter 18a and an amplifier 17a are connected upstream of the DC/DC converter 19a, and its input is connected to the output of the first feed element 17b. On the output side, the DC/DC converter 19a is connected via a low-pass filter to the first connection of the second feed element 150. A node V2 at the output of the second feed element 150 is fed back to the second connection of the first feed element 170. In a corresponding manner, the first connection of the first feed element 170 together with the second connection of the second feed element 150 are designed to supply the radio-frequency component in the second feed element.

This embodiment allows the efficiency of the voltage control circuit to be considerably improved by the use of the two-point principle. This will be explained using the following example.

On the basis of its specification for the medium data rate, the Bluetooth mobile communication standard has a payload signal bandwidth of 1 MHz. The payload signal is both phase-modulated and amplitude-modulated at a frequency of 1 MHz. A wider amplitude modulation bandwidth is required to achieve this payload signal bandwidth in a polar modulator, in order to avoid distortion during the amplitude modulation. For example, the bandwidth of the amplitude modulation signal is greater by a factor of 10. In order to achieve the bandwidth of about 10 MHz using a conventionally clocked DC/DC converter or voltage converter with a control loop as the voltage control circuit, the switching clock frequency of the converter would have to be considerably higher than 50 MHz, preferably 100 MHz.

In the same conditions, this would result in a switching frequency of 27 MHz with a payload signal bandwidth of 270.83 KHz for the EDGE mobile radio standard. Taking account of the requirements for electromagnetic compatibility (EMC), it would even be necessary to increase the switching clock frequency of a DC/DC converter to more than 80 Megahertz in particular for the EDGE mobile radio standard. High switching frequencies such as these require special components which are highly costly. Furthermore, the efficiency of a converter operating at these high frequencies falls.

The splitting of the amplitude modulation signal into a radio-frequency component and a low-frequency component, as well as their different processing, in particular supplying the radio-frequency component to the second feed element, make it possible to reduce the requirements for the switching frequency of the DC/DC converter that is arranged in the control loop. In this case, it has been found that efficiencies of 92% and more can be achieved. Low switching frequencies within the DC/DC converter (which is operated on a clocked basis) in the voltage control circuit can also be coped with considerably better for electromagnetic compatibility reasons.

Figure 2:
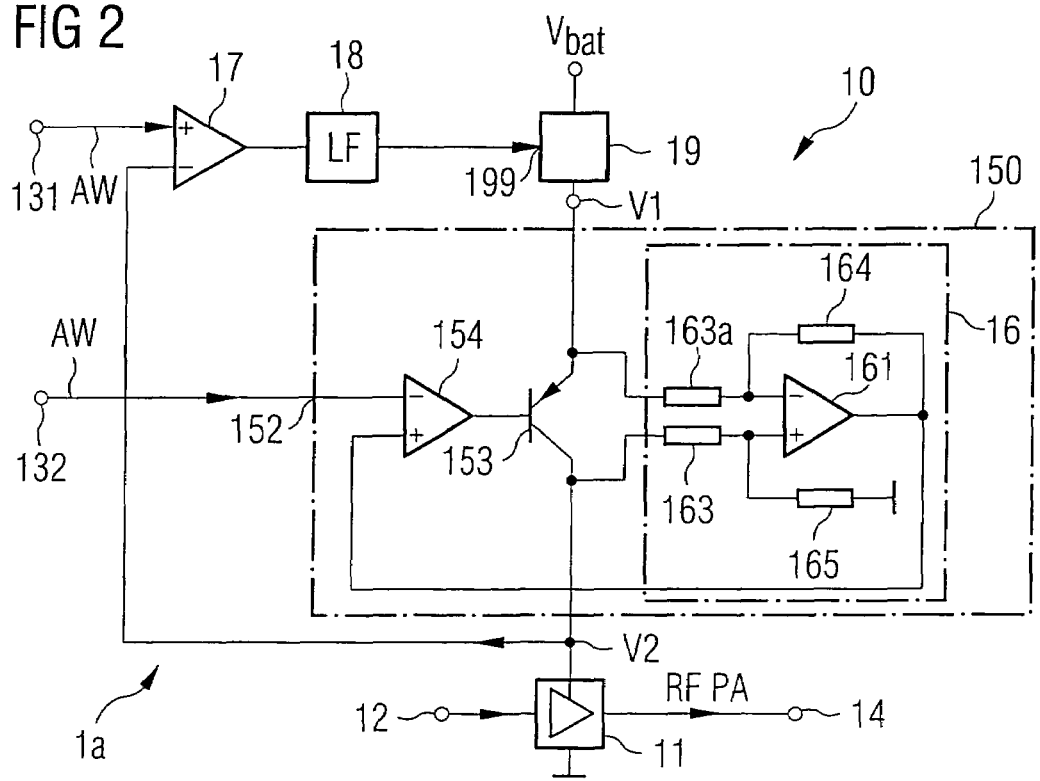
FIG. 2 shows a first embodiment of the voltage control circuit.

FIG. 2 shows one specific refinement of a voltage control circuit according to the invention. The illustrated voltage control circuit 1 is connected between a battery supply voltage $V_{bat}$ and a radio-frequency amplifier 11. The supply voltage of the radio-frequency amplifier 11 is modulated with the aid of an amplitude modulation word AW. In consequence, the supply voltage to the radio-frequency amplifier 11 is varied in accordance with a predetermined amplitude modulation, thus correspondingly changing the radio-frequency signals which are applied to its input 12. The radio-frequency amplifier 11 thus amplitude-modulates its radio-frequency signal that is to be amplified.

The voltage control circuit 1 contains a control amplifier 17 which forms the first feed element 170. The control amplifier 17 has a first input + in order to supply the amplitude modulation word AW to the connection 131. The second input − forms the feedback path, and is connected to the voltage node V2. The second feed element 150 is formed by a series voltage regulator. The second feed element 150 contains a connection 152, to which the amplitude modulation word AW can likewise be supplied. The series voltage regulator comprises a differential amplifier 154, whose output is connected to a control connection of a transistor 153. The transistor 153 is in the form of a power transistor, in particular a bipolar transistor, and forms a controllable-conductance switched path, and is used for modulation of the radio-frequency component of the amplitude modulation word AW onto the supply voltage.

In the present embodiment, the second feed element, which is in the form of a series regulator, is connected such that the output voltage of the differential amplifier 154 is not regulated with respect to ground, but with respect to a voltage drop across the power transistor 153. An additional differential amplifier in the form of a subtractor 16 is provided for this purpose. The second differential amplifier 161 for the subtractor 16 is connected by a first input − to the emitter of the bipolar transistor 153. The second input + is connected via a resistor 162 to the collector connection of the bipolar transistor 153. The output of the differential amplifier is fed back via a resistor 164 to its input −, and is at the same time connected to the input + of the differential amplifier 154 in the series regulator. Furthermore, the second input + of the differential amplifier 161 of the subtractor 16 is connected via a resistor 165 to the ground potential.

The input of the voltage regulator at the node V1 is connected to the output of the voltage converter 19, which is referred to in the following text as a DC/DC converter. This uses a set signal at its set input 199 to convert the supply voltage $V_{bat}$ to a second supply voltage, and emits this at its output. The set signal is obtained from the low-frequency component. The set signal input 199 of the DC/DC converter 19 is connected via a loop filter 18 to the output of the control amplifier 17. The loop filter 18 may also, of course, be contained in the circuitry of the control amplifier 17.

The sum of an output voltage from the voltage converter 19 is available at the output node V2 of the voltage control circuit as shown in FIG. 2, taking into account the applied voltage drop which is produced by the radio-frequency signal. The small amount of signal energy in the high-pass component in the amplitude modulation word means that there is only a relatively small voltage drop across the voltage adder 15. The power losses in the voltage control circuit are thus kept low, in contrast to the power losses in the case of a pure series regulator approach.

Figure 3:
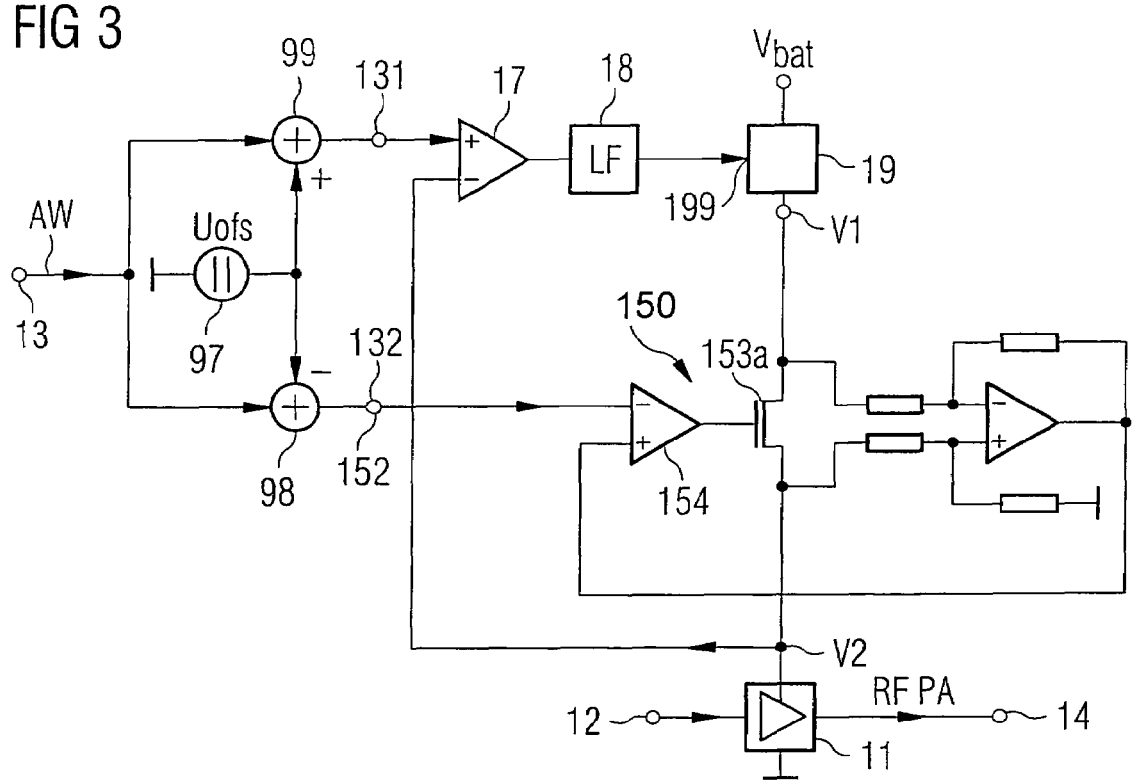
FIG. 3 shows a second embodiment of the voltage control circuit according to the invention.

FIG. 3 shows a further refinement of the voltage control circuit. In this case, the bipolar transistor 153, which is in the form of a power transistor, is replaced by a field-effect transistor 153a. The voltage cannot be increased by the voltage adder 150 connected as a series regulator, and in particular by the field-effect transistor 153a. In fact, in the present embodiment, a voltage is always dropped across the transistor and likewise reduces the total supply voltage at the node V2. In order to compensate for this effect, it is thus expedient for the control circuit 15 to act as an adder, in order to add a DC voltage component at the set input of the DC/DC converter 19. This should be sufficiently large to avoid saturation of the field-effect transistor 153a in the voltage adder 15.

The same voltage component in the set signal of the DC/DC converter which leads to a voltage increase at the node V1 must be corrected again with respect to the output node V2. For this purpose, a corresponding DC voltage signal is fed in at the connection 132 for the radio-frequency component, and is supplied to the differential amplifier 154 in the voltage adder 15. The DC voltage which is supplied from the DC voltage source Uofs at the connections 131 and 132 is in each case of the same magnitude, but of the opposite mathematical sign. This is achieved by connecting an adder 99 upstream of the connection 131. The output of a subtractor 98 is connected to the connection 132. The respective first input of the adder and of the subtractor 98 is connected to the connection 13 for supplying the amplitude modulation word AW. In this case, the difference between the amplitude modulation word AW and the DC voltage signal from the source Uofs is supplied to the connection 132. The sum of the DC voltage component from the source Uofs and the amplitude modulation word is fed in at the connection 132 to the input of the control amplifier 17.

The DC voltage signal which is produced by the source Uofs determines, in its quantitative definition, the efficiency advantage of the overall arrangement. The smaller this DC voltage component is, the less is the voltage drop across the power transistor 153a, which in turn minimizes the power losses. On the other hand, it is necessary to choose the DC voltage component to be correspondingly high in order to prevent saturation of the transistor 153a, and thus distortion on the modulated supply voltage, in the event of large positive signal peaks in the radio-frequency component of the amplitude modulation signal AW.

The maximum radio-frequency components of the amplitude modulation signal that occur are in this case dependent on the type of modulation and on the low-pass filter cut-off frequency of the outer control loop of the loop filter 18. The so-called crest factor can be used as a criterion for this purpose, which characterizes the maximum power that occurs in the signal with respect to the average power of the signal. By way of example, the crest factor for the WCDMA/FDD mobile radio standard is 10.4 dB. The typical signal crest factor in the GSM/EDGE mobile radio standard is 3.4 dB. This means that the peak output power of a signal to be transmitted in the WCDMA Standard is 10.4 dB, and that in the GSM/EDGE Standard is about 3.4 dB above the average power level. The probability of a peak power level such as this is, of course, extremely low.

FIG. 9 shows a refinement of a DC/DC converter 19 as is implemented in one refinement of the voltage control circuit according to the invention. A converter such as this is also referred to as a switched-mode regulator. In principle, it is possible to use all converters which transform a basic voltage to an output voltage as a function of a variable converter ratio. Identical reference symbols indicate components having the same effect or function.

The DC/DC converter 19 has a monitoring device 191 for controlling the output voltage and, inter alia, this monitoring device 191 contains an actuating element, which is not illustrated. The monitoring device has a reference input 296 for supplying a clock signal at the frequency $f_{ref}$, from which the switching frequency for operation of the converter is derived in the monitoring circuit, for example by means of a phase locked loop which is not illustrated. It is advantageous to use an external clock signal because this makes it possible to achieve synchronism between the switching clock and the low-frequency component supplied in the amplitude modulation word. The clock signal may, of course, also be used directly at the input 296. The illustrated DC/DC converter is thus in the form of a converter which can be operated with the clock signal.

The low-frequency component of the amplitude modulation word is supplied to the monitoring circuit 191 at the input 199. The monitoring circuit 191 is connected on the output side via two control connections 294 and 295 to the control connections or gates of two series-connected field-effect transistors 192 and 193. These are arranged between the supply voltage $V_{bat}$ and ground potential. A node 195a is provided between the field-effect transistors 193 and 192, and is connected to a coil 195, which is used together with the capacitor 197 as a store for energy storage. The capacitor 197, which is connected to the other connection of the coil 196 via a small resistor 196 and is connected to the output 297, furthermore smoothes the voltage which is emitted from the DC/DC converter 19 at the output point V1.

A current flow through the coil 195 is produced by alternately driving the field-effect transistors 192 and 193 by means of the monitoring circuit 191, which also acts as a setting element. The inductance of the coil forms the energy store, and emits the stored energy in the form of a voltage at the output 297. The connection 298 for supplying the battery voltage $V_{bat}$ is connected to a capacitor 290 in order to suppress current and voltage fluctuations caused by the control system on the supply line. In addition, a Schottky diode 194 is connected in parallel with the transistor 193, and prevents current from flowing in the backward direction.

The control signal at the set signal input 199 changes the switching times for the transistors 192 and 193. The current flowing through the coil 195 and the output voltage at the output 297 are thus also changed. Because of the considerably higher switching frequencies, for example higher by a factor of 10 than the maximum frequency of the control signal, a stable and accurately set voltage is nevertheless produced at the output V1. If the load on the output is constant, the additional voltage fluctuations caused by the switching frequency at the output are compensated for by the capacitor.

Figure 5:
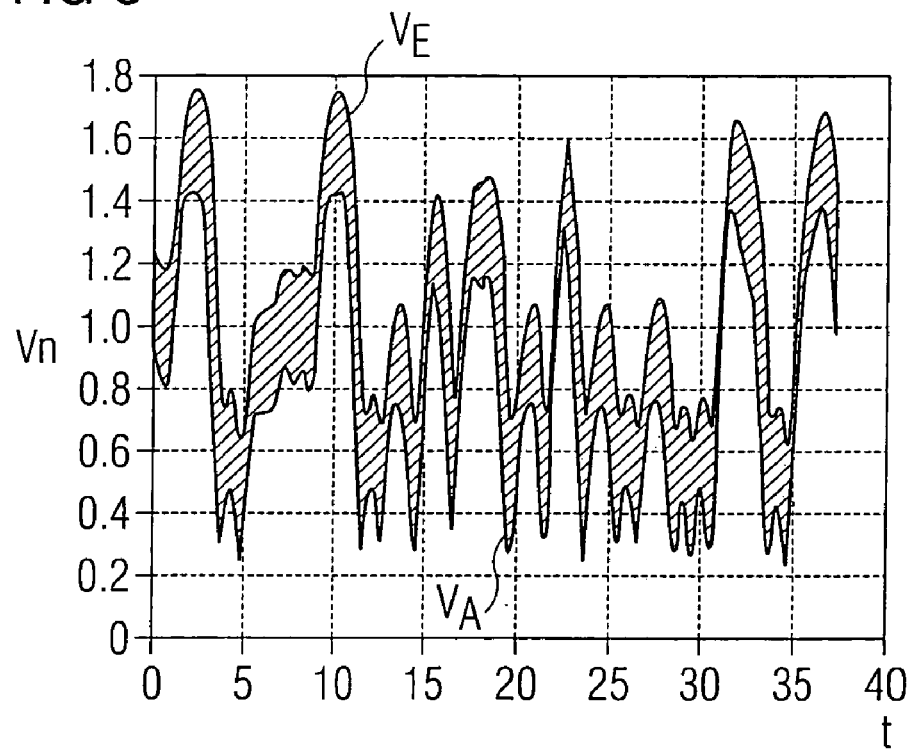
FIG. 5 shows a time/voltage diagram in order to explain the power losses.

FIG. 5 shows the voltage drop over time for a known voltage regulator according to the embodiment of the invention. The illustration shows 40 random symbols of the modulation used for the EDGE Standard, as well as the output voltage $V_A$ of the known voltage control circuit. The curve VE in this case denotes the input voltage at the node V1. The shaded area that is shown between the two curves of the output voltage $V_A$ and the input voltage $V_E$ represents the voltage drop over time, and thus represents a measure of the power losses in the known voltage regulator. The additional radio-frequency control within the DC/DC converter considerably reduces the losses in the form of the voltage drop across the series regulator.

Figure 6:
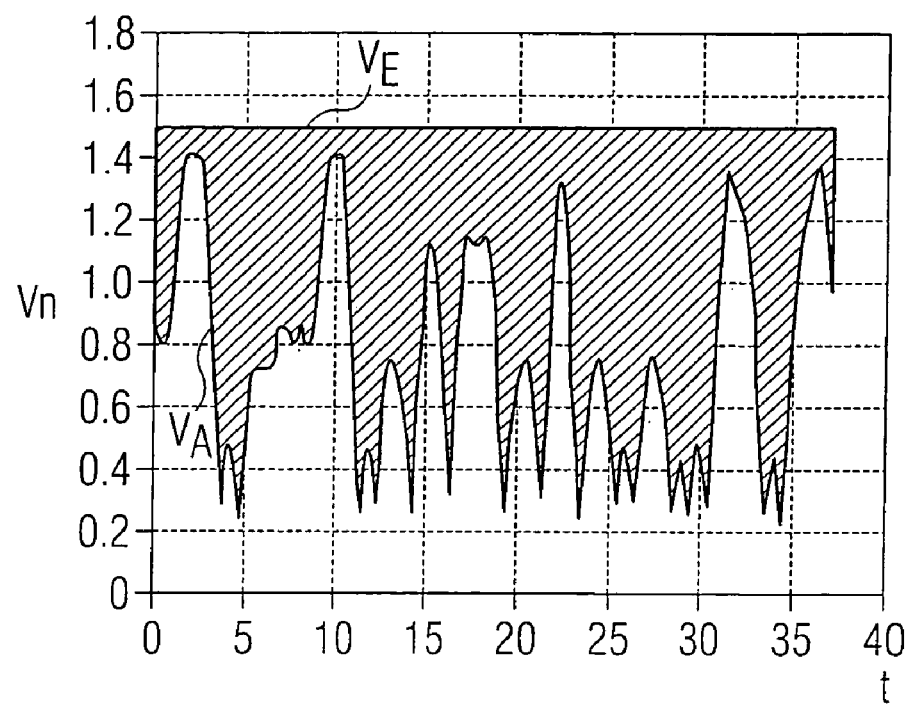
FIG. 6 shows a time/voltage diagram of a conventional voltage control circuit in order to explain the power losses.
Figure 7:
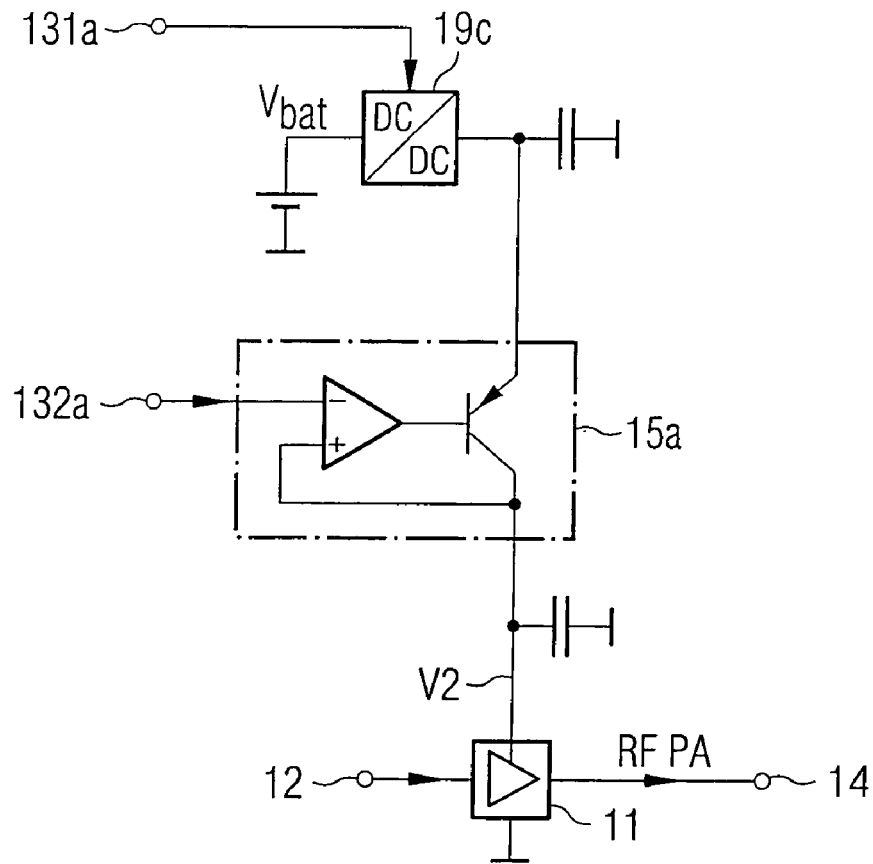
FIG. 7 shows a first known voltage control circuit.
Figure 8:
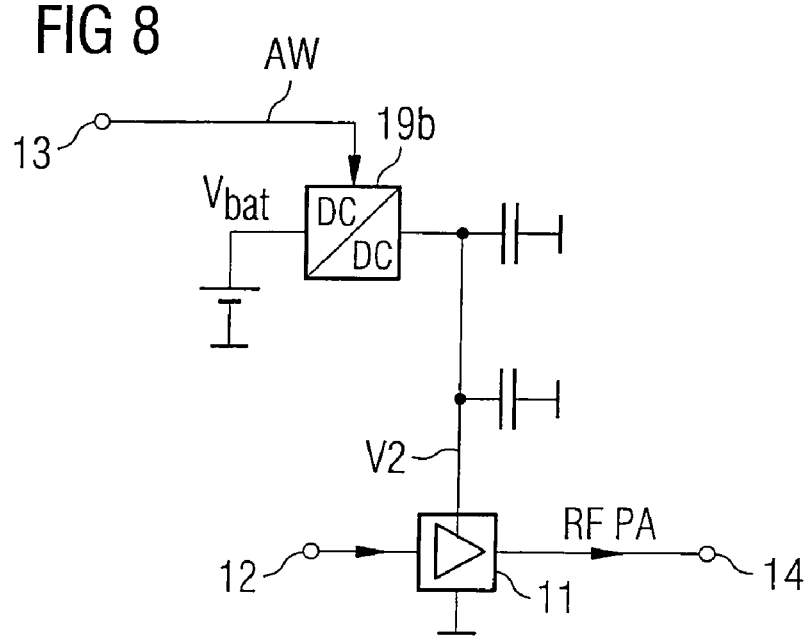
FIG. 8 shows a second known voltage control circuit.

FIG. 6 shows a voltage/time diagram of one embodiment of the voltage regulator shown in FIG. 7. Because the input voltage $V_E$ is constant, the voltage drop across the voltage regulator is in some cases very high, and the power losses are correspondingly high, in comparison to the diagram in FIG. 5.

Figure 4:
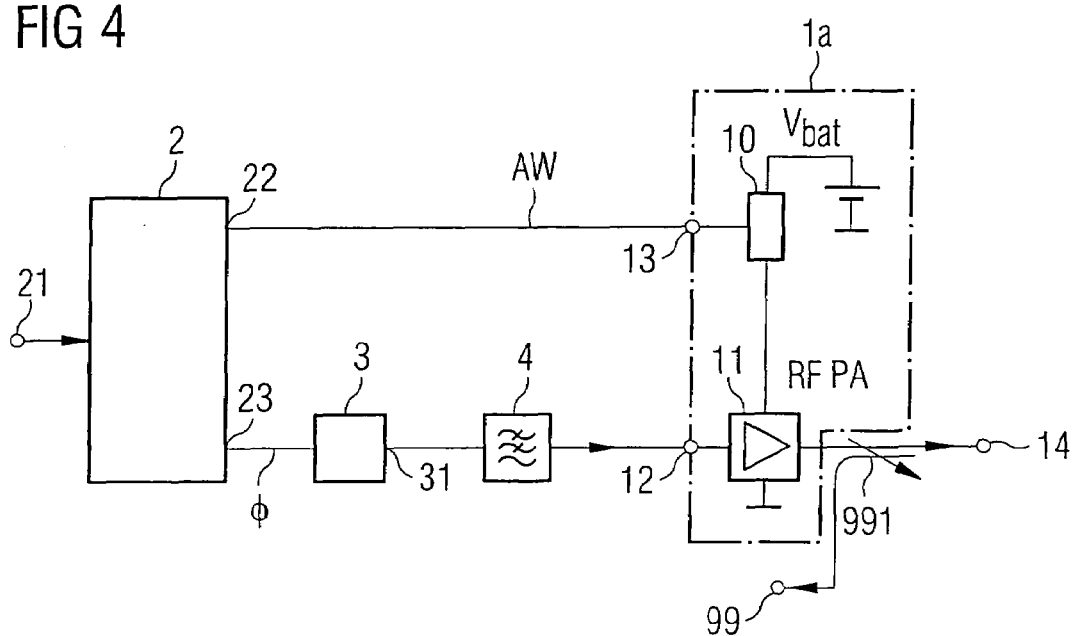
FIG. 4 shows a polar modulator with the voltage control circuit according to the invention.

FIG. 4 shows a polar modulator with a voltage control circuit according to the invention. In the illustrated polar modulator, the amplitude modulation signal is modulated in the form of an amplitude modulation word AW onto the supply voltage for a radio-frequency amplifier 11, which amplifies the phase-modulated radio-frequency signal. The output power of the radio-frequency signal is varied in a corresponding manner by the amplitude modulation of the supply voltage.

The polar modulator as shown in the embodiment in FIG. 4 comprises a signal pre-processing circuit 2 with an input 21 as well as a first output 22 and a second output 23. The data to be transmitted is supplied to the input 21 of the signal pre-processing circuit 2. The signal pre-processing circuit 2 modulates this data to be transmitted in accordance with the predetermined type of modulation into a phase modulation word φW and an amplitude modulation word AW. The phase modulation word φW contains the phase information of the modulated data, while the amplitude modulation word AW comprises not only the pure amplitude modulation but also power level information, which indicates a desired total output power of the radio-frequency signal. The phase modulation word φW is produced at the output 23, and is supplied to a phase modulator 3. By way of example, the phase modulator 3 is in the form of a two-point modulator with a phase locked loop and frequency synthesis. This modulates the phase information onto the carrier signal, and, at its output 31, emits a phase-modulated carrier signal to the low-pass filter 4. The phase-modulated carrier signal that has been low-pass filtered is supplied to the input 12 of the radio-frequency amplifier. The amplitude modulation word AW is produced by the signal pre-processing circuit 2 at its output 22, and is fed to the input 13. The input 13 forms a part of the voltage control circuit 10, which is connected to the battery supply voltage $V_{bat}$ and whose output is connected to the supply input of the radio-frequency amplifier 11.

The voltage control circuit splits the amplitude information applied to its input 13 into a radio-frequency component and a low-frequency component. The supply voltage signal that has been modulated in this way is supplied to the supply input of the radio-frequency amplifier 11. On the output side, the radio-frequency amplifier 11 emits an amplitude-modulated and phase-modulated radio-frequency signal. A power level detector 991 in the form of a directional coupler determines the power of the output signal, and supplies it to a connection 99, which is used for any necessary control reduction for correction of the output power. The output signal is produced at the input 14.

The proposed voltage control circuit and the proposed method allow amplitude modulation also to be carried out with clocked DC/DC converters in order to vary the supply voltage to a radio-frequency amplifier. In this case, the amplitude information is, according to the invention, split into a radio-frequency component and a low-frequency component, and is processed further. The voltage control circuit may thus have a modulator with a feed element for the low-frequency component, and a feed element for the radio-frequency component. Because the power losses during this processing are reduced, the overall efficiency of the arrangement rises, and the circuit can preferably be in the form of an integrated circuit in a semiconductor body with low heat losses. The elements and arrangements of the various embodiments described here may, of course, be combined as required without departing from the essence of the invention.

The invention claimed is:

1. A voltage control circuit, comprising:
    an input configured to supply an input voltage;
    a circuit output configured to output a supply voltage;
    a control input configured to supply a voltage control signal for adjustment of the supply voltage;
    a voltage converter whose output voltage is variable, having a converter control input, wherein the voltage converter is configured to emit the output voltage at an output based on an input voltage, which is applied to an input, and a control signal at the converter control input;
    a control loop with the voltage converter arranged between a first element and a second element;
    wherein the first element is configured to emit the difference between signals which are applied to a first and to a second connection thereof, with the first connection being coupled to the control input and with the second connection being coupled to the circuit output, forming a feedback path; and
    wherein the second element is configured to emit the sum at the circuit output of signals which are applied to a first and to a second connection thereof, with the first connection being coupled to the output of the voltage converter, and the second connection being coupled to the control input of the voltage control circuit.

2. The voltage control circuit of claim 1, wherein the voltage converter comprises a reference input configured to supply a reference clock signal and is in the form of a DC/DC converter, or a part of a DC/DC converter.

3. The voltage control circuit of claim 1, further comprising a loop filter connected upstream of the voltage converter in the control loop.

4. The voltage control circuit of claim 1, wherein the first element comprises a control amplifier, with a first input of the control amplifier forming the first connection of the first element, and a second input of the control amplifier forming the second connection of the first element.

5. The voltage control circuit of claim 1, wherein the second element comprises a series regulator.

6. The voltage control circuit of claim 1, wherein the second element comprises a controllable-conductivity path connected in series between the first connection of the second element and the output of the voltage control circuit.

7. The voltage control circuit of claim 6, wherein the second element comprises a differential amplifier whose output is coupled to a control input of the controllable-conductivity path.

8. The voltage control circuit of claim 6, wherein the controllable conductivity path comprises at least one bipolar transistor.

9. The voltage control circuit of claim 6, wherein the controllable conductivity path comprises at least one field effect transistor.

10. The voltage control circuit of claim 1, in-which wherein the second element is configured to determine a voltage drop across a controllable conductivity path.

11. The voltage control circuit of claim 6, wherein the second element comprises a subtractor, whose two inputs are connected to the controllable conductivity path and whose output is fed back to an input of the differential amplifier.

12. The voltage control circuit of claim 1, wherein a correction device is connected upstream of the first connection of the first element and of the second connection of the second element, and is configured to emit a first voltage to the first connection of the first element, and to emit a second voltage to the second connection of the second element.

13. The voltage control circuit of claim 12, wherein the sum of the first voltage and of the second voltage results in the value 0 V.

14. A voltage control circuit, comprising:
    a circuit voltage output configured to output a voltage signal;
    a voltage converter configured to generate a controllable output voltage;
    a control input configured to supply a control signal with a radio frequency component and a low frequency component; and wherein the control input is coupled to a control input of the voltage converter and to an output of the voltage converter for two point modulation of the voltage signal provided at the voltage output.

15. The voltage control circuit of claim 14, wherein the voltage control circuit is configured to control the voltage converter with the low frequency component and supply the radio frequency component to the circuit voltage output.

16. A method for supplying an electrical component with a supply voltage, comprising:
   producing a modulation signal;
   producing an input voltage;
   determining a first signal element with a first frequency component from the modulation signal, and determining a second signal element with a second frequency component from the modulation signal;
   producing a first voltage from the input voltage as a function of the first signal element;
   modulating the first voltage as a function of the second signal element; and
   supplying the modulated first voltage as a supply voltage to the electrical component.

17. The method of claim 16, wherein modulating the first voltage comprises:
   adding the second signal element to the first voltage, and
   subtracting the second signal element from the first voltage.

18. The method of claim 16, wherein producing the first voltage comprises:
   providing a voltage converter with a variable converter ratio;
   using the first signal element to set a conversion ratio of the voltage converter; and
   converting the input voltage to the first voltage.

19. The method of claim 18, wherein providing the voltage converter comprises providing a DC/DC voltage converter or of a switched mode regulator with a variable conversion ratio.

20. The method of claim 16, wherein determining the first and second signal elements comprises:
   providing a first and a second signal path; and
   suppressing the first frequency range in the first signal path.

* * * * *

UNITED STATES PATENT AND TRADEMARK OFFICE
CERTIFICATE OF CORRECTION

PATENT NO. : 7,420,411 B2 Page 1 of 1
APPLICATION NO. : 11/370752
DATED : September 2, 2008
INVENTOR(S) : Stefan Herzinger et al.

It is certified that error appears in the above-identified patent and that said Letters Patent is hereby corrected as shown below:

Column 2, line 2; please replace "131 a" with --131a--
Column 12, claim 10, lines 45 & 46; please replace "in-which wherein" with --wherein--

Signed and Sealed this

Twenty-fifth Day of November, 2008

JON W. DUDAS
*Director of the United States Patent and Trademark Office*